United States Patent [19]

Brandstetter et al.

[11] Patent Number: 4,699,466

[45] Date of Patent: Oct. 13, 1987

[54] OPTICAL RF FILTERING SYSTEM

[75] Inventors: Robert W. Brandstetter, Levittown; Adrian R. Doucette, deceased, late of Garden City, by Mary Alyce Doucette, executrix; Herman Kaplan, Great Neck; Charles E. Lindig, Huntington; Nils J. Fonneland, Lake Ronkonkoma, all of N.Y.

[73] Assignee: Grumman Aerospace Corporation, Bethpage, N.Y.

[21] Appl. No.: 716,568

[22] Filed: Mar. 27, 1985

[51] Int. Cl.$^4$ .............................................. G02B 27/46
[52] U.S. Cl. .......................... 350/162.12; 350/331 R; 350/358
[58] Field of Search ................ 350/162.12, 358, 331 R

[56] References Cited

U.S. PATENT DOCUMENTS

| | | | |
|---|---|---|---|
| 2,451,465 | 10/1948 | Barney | 250/550 |
| 2,643,286 | 6/1953 | Hurvitz | 350/372 |
| 3,430,047 | 2/1969 | Hurkamp | 455/619 |
| 3,482,102 | 12/1969 | Thomas | 350/162 SF |
| 3,636,330 | 1/1972 | Holeman et al. | 350/162 SF |
| 3,699,347 | 10/1972 | Buchan et al. | 250/550 |
| 3,700,902 | 10/1972 | Buchan | 250/201 |
| 3,821,548 | 6/1974 | Jernigan | 364/825 |
| 3,977,771 | 8/1976 | Horner | 350/162 SF |
| 4,060,316 | 11/1977 | Pollack et al. | 353/20 |
| 4,071,907 | 1/1978 | Casasent | 350/162 SF |
| 4,108,538 | 8/1978 | Felstead | 350/162 SF |

OTHER PUBLICATIONS

Peter Lewis, "An Optical Signal Processing Technique for Directional Systems Using Circular Arrays", Optica Acta, 1970, vol. 17, No. 1, pp. 19–36.

William T. Mayo, Jr., "Antenna Pattern Synthesis with an Imaging Optical Heterodyne Receiver", Proc. of the IEEE, Jun., 1970, pp. 943–944.

R. M. Craig et al., "Bubble Domain Electronic-to-Optical Image Transducer", IBM Tech. Discl. Bull., vol. 13, No. 1, Jun., 1970, pp. 147 & 148.

J. N. Lee et al., "High-Speed Adaptive Filtering & Reconstruction of Broad-Band Signals Using A.O. Techs.", 1980, U.S. Army Electronics R & D Command, Harry Diamond Labs., Adelphi, Md.

A. Korpel, "Acousto-Optics—A Review of Fundamentals", Proceedings of the IEEE, vol. 69, No. 1, Jan., 1981, pp. 48–53.

W. T. Rhodes, "Acousto-Optic Signal Processing: Convolution and Correlation", Proceedings of the IEEE, vol. 69, No. 1, Jan., 1981, pp. 65–78.

T. M. Turpin, "Spectrum Analysis Using Optical Processing", Proceedings of the IEEE, vol. 69, No. 1, Jan., 1981, pp. 79–92.

*Primary Examiner*—Bruce Y. Arnold
*Attorney, Agent, or Firm*—Richard G. Geib

[57] ABSTRACT

An optical notching filter in which a band of radio frequencies such as the RF input of a radio receiver is an input signal. The input signal modulates a laser beam and the modulated beam is optically Fourier transformed. A programmable optical notching filter spatially filters the electromagnetic interference noise from the transformed beam and the thus filtered beam is optically inverse Fourier transformed. A photo-combining of the filtered beam with a focused laser local oscillator beam down-converts the filtered beam to the original input signal minus electromagnetic interference.

10 Claims, 11 Drawing Figures

OPTICAL RF FILTERING SYSTEM

BACKGROUND OF THE INVENTION

1. Field of the Invention

This invention relates to optical information processing and, more particularly, to the optical filtering of RF signals.

2. Discussion of the Prior Art

A spread spectrum radio receiver often is required to operate in an environment where electromagnetic interference (EMI) signals may degrade its performance. Often these EMI signals are relatively stationary in time and frequency while those that are changing do so relatively slowly with respect to the desired signals. For efficient signal reception it is required that the EMI signals be filtered out to the maximum extent possible. It has been the normal practice to employ electronic means to accomplish the filtering function, Electronic filters usually are of the cascade electronic filter type. It has been found, however, that electronic filtering means have a number of disadvantages, particularly where weight and space factors are involved. Weight and volume are proportional to the number of filters required which depend on the number of channels involved. Also, in electronic filters, phase distortion is additive and nonlinear. Electronic filter elements interact with one another and they themselves are subject to EMI. For these and other reasons, other techniques such as optical filtering of RF signals have increasingly become of interest.

The prior art shows a number of examples of optical systems for detecting and/or removing EMI noise signals from an electrical signal input. An example of an optical matched filter system for recognizing a specific coded pulse is disclosed by J. L. Jernigan in U.S. Pat. No. 3,821,548. A drawback of the disclosed Jernigan system is that it is designed to respond only to a specific predetermined coded pulse and it is not provided with means to automatically adapt the device to filter a variable signal input. However, adaptive or programmable optical systems for filtering electrical signals are known in the prior art as evidenced by W. R. Buchan in U.S. Pat. No. 3,700,902; J. N. Lee, et. al. in a paper "High-Speed Adaptive Filtering and Reconstruction of Broad-Band Signals Using Acoustic-Optic Techniques," 1980, U.S. Army Electronics Research and Development Command, Harry Diamond Laboratories, Adelphi, MD; and T. M. Turpin in a paper "Spectrum Analysis Using Optical Processing", Proceedings Of the IEEE, Vol. 69, No. 1, January, 1981. There are points of similarity between the last three prior art teachings mentioned above and the optical RF filtering system of the present invention but the prior art design approaches militate against the attaining of a practical system that can be implemented for use in adverse environmental conditions such as would be present in an optical RF filtering system designed for use in airborne radar systems and the like.

SUMMARY OF THE INVENTION

As stated previously, a spread spectrum radio receiver often is required to operate in an environment where spurious interfering signals can degrade its performance. These interfering signals can be relatively stationary in time and frequency or they can be changing relatively slowly with respect to the desired signals. This invention is an optical filtering system for broad band RF signals, the system having a filter that can be dynamically programmed on a continual basis to reject the interfering signals with a minimal effect on the desired signals.

In the system of this invention, a beam of coherent radiation is modulated with the received RF signal. A small portion of this beam is sampled and, using predetermined criteria, the noise data points in the receiver RF signal are detected and identified. This noise spectra location information is used to program a programmable spatial filter. The remainder of the beam is directed through the programmed spatial filter such that the unwanted noise spectra is rejected in the optical domain. This filtered optical carrier with the signal is then down converted to the RF and outputted for conventional post processing.

In this invention, therefore, a laser beam is modulated with the RF spectra $g(t)$ to produce $g(t-x+2D)/(V) = g(x,t)$. An optical Fourier transform is taken of this modulated beam $g(x,t)$ to derive the optical frequency distribution $G(p,t)$ where $p$ is spatial frequency. The transformed transferred beam $G(p,t)$ is then passed through a programmable spatial filter (PSF) where unwanted frequencies are filtered or notched out. This produces $G'(p,t)$ which is a spatially filtered Rf modulation riding on the laser beam exiting the PSF. An optical inverse Fourier transform is taken of $G'(p,t)$ producing $g'(x,t)$. To obtain the filtered RF spectra in the time domain only, the inverse Fourier transform $g'(x,t)$ is optically summed through a selected aperture with a laser reference beam (or local oscillator). The RF difference is detected in a square-law photodetector eliminating the positional dependence, producing $g'(t-T_o)$, where $T_o$ is an adjustable fixed time delay.

It is thus a principal object of the invention to provide an optical system for the adaptive noise filtering of RF spectra and further to provide continually controllable adaptive filtering of RF spectra in both frequency and amplitude.

It is another object of the invention to provide an optical filtering system in which parallel programming of one or more filter channels can be achieved to filter any number of RF signals automatically in a parallel process such that EMI is adaptively removed anywhere in the received RF band.

A further object of the invention is to provide an optical filter in which signal filtering is possible while the channel is being programmed (read-while-write programming).

Yet another object of the invention is to provide an optical filter system in which the filter is programmable to over 1000 elements such that high resolution is attained.

Other objects and advantages will become apparent from a reading of the Specification and from a study of the accompanying drawings.

DESCRIPTION OF THE DRAWINGS

For the purpose of illustrating the invention, there is shown in the drawings the forms which are presently preferred; however, it should be understood that the invention is not necessarily limited to the precise arrangements and instrumentalities here shown.

DESCRIPTION OF THE PREFERRED EMBODIMENTS

Figure 1:
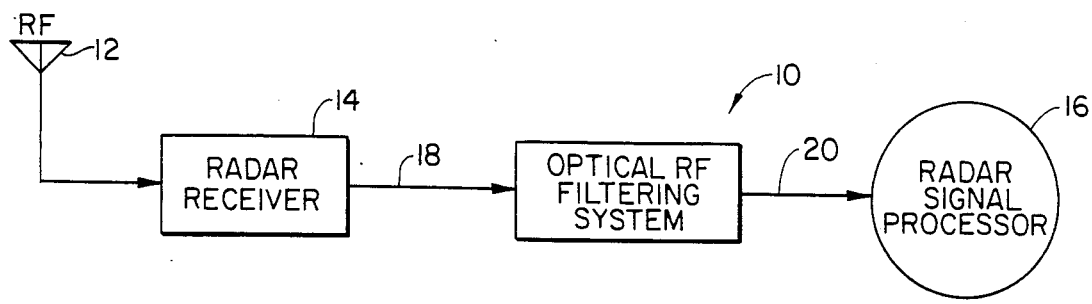
FIG. 1 is diagrammatic representation of the RF filtering system of the invention embodied in a radar system.
Figure 2:
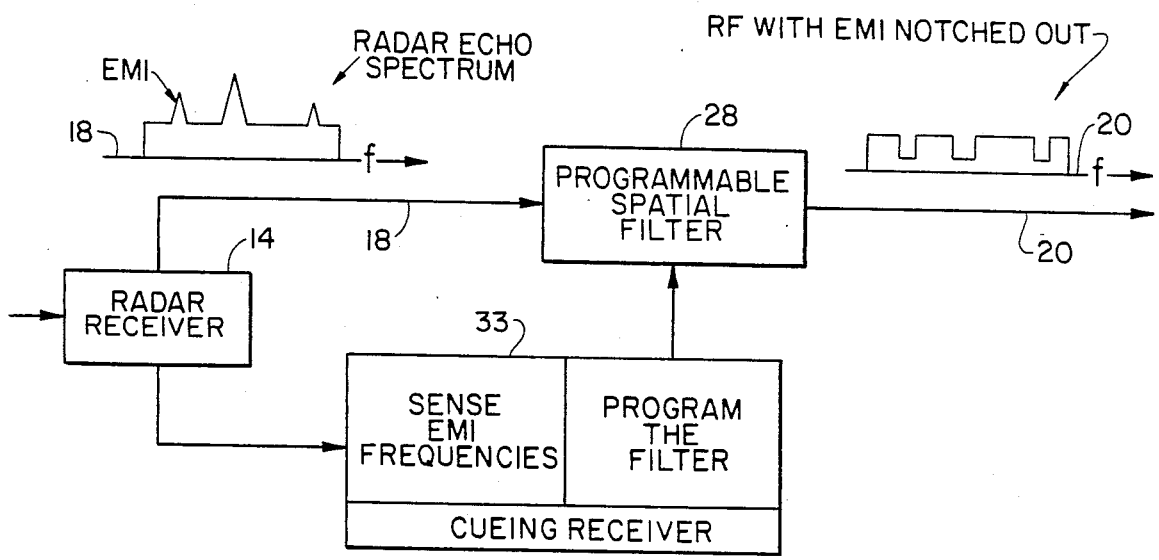
FIG. 2 is a functional diagrammatic representation of the RF filtering system of the invention.

With reference now to the drawings, FIG. 1 shows the optical RF filtering system 10 incorporated into a radar system having an antenna 12, radar or radio receiver 14, and signal utilizing means which can comprise a radar scope 16 or the like. Preferably the radar system is of the spread-spectrum type. As further shown in simplified form in FIG. 2, the input RF signal 18 from the radar receiver 14, which signal contains EMI or noise, is passed to the filtering system 10 where the location of EMI in the frequency spectrum is detected and a programmable notching filter is programmed to notch out the EMI and a filtered signal having notches where the EMI was removed is outputted 20.

Figure 3:
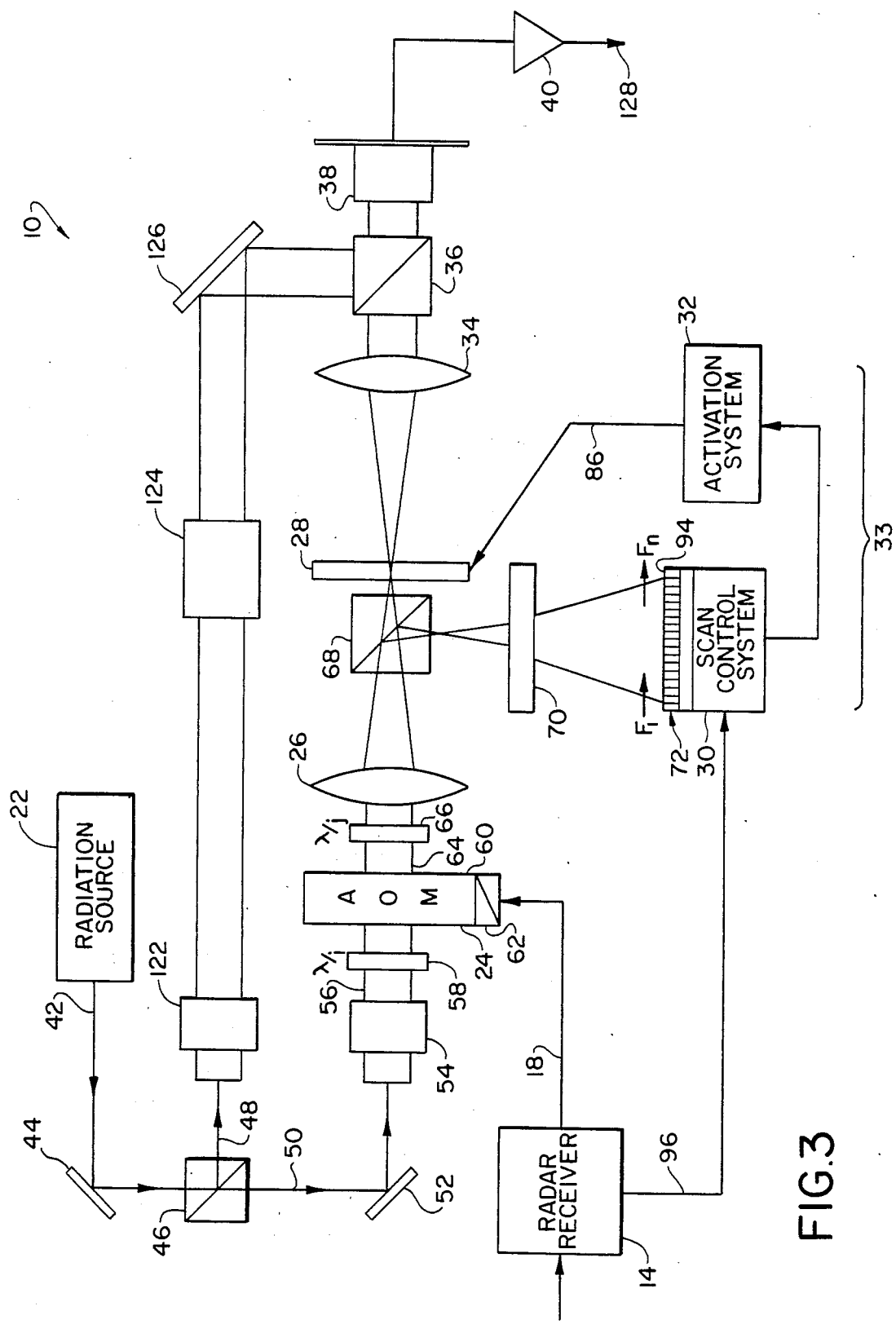
FIG. 3 is a schematic diagram of the optical RF filtering system of the invention.

As perhaps best shown in FIG. 3, optical RF filtering system 10 has a radiation source 22, an acousto-optic modulator (AOM) 24, a transform means such as a lens 26, a programmable spatial filter (PSF) 28, the scan control system 30 and the filter activation system 32 of a cueing system 33, an inverse optical transform means such as a lens 34, an optical combiner 36, a photodetector 38, and an electronic filter 40.

Figure 4:
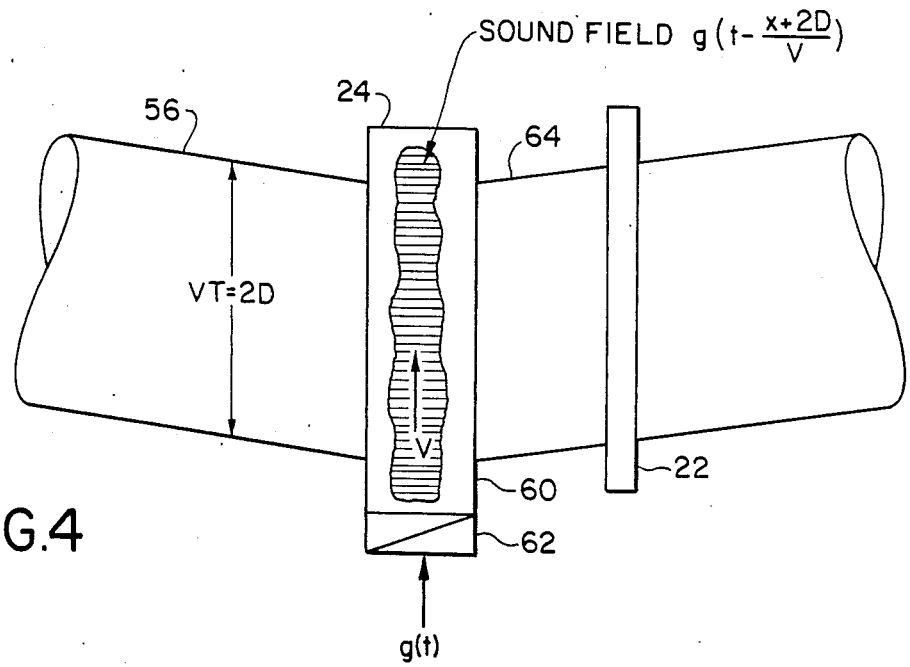
FIG. 4 is a schematic diagram of an acousto-optic modulator embodied in the invention.

Radiation source 22 can be a laser such as a helium-neon gas laser or a Laser Diode (LED), such as HCP1600 commercially available from Hitachi American Ltd., or any other appropriate source producing a beam 42 of collimated, substantially coherent radiation. Operating efficiency is greatest with single-frequency laser operation which can be obtained by incoporating an etalon or similar known means in the radiation source. Laser output beam 42 is directed as by a mirror 44 to a beamsplitter 46 where a beam 48 to be utilized for a local oscillator function is derived. Radiation 50 passing directly through the beamsplitter is used as the signal beam. Signal beam 50 is directed by means such as a mirror 52 into a beam expander 54 to produce a sheet beam 56 which, after being appropriately polarized as by the wave plate 58, is directed through the AOM 24 which suitably is a Bragg Cell for imposing RF signal spectral intelligence on the signal beam 56. It is well known that light passing through a Bragg Cell will be diffracted into a first order output beam and a zero order output beam. In the interests of clarity, however, only a first order output beam 64 is shown in FIG. 4. If a Bragg Cell is used for the AOM 24, it typically comprises an optical medium such as crystal element 60 driven by an appropriate transducer 62 in a known manner (see FIG. 4). As is known, the time-bandwidth product (T) (BW) determines the resolution of the AOM 60, where BW is the bandwidth and T is the time aperture of the AOM. Therefore, for a given bandwidth within the limits of the acoustic materials, the time length (T) of the AOM will determine the resolution. For example, a typical AOM might have a bandwidth of 100 MHz. For a resolution of 1000 elements (using Rayleigh Criterion), 100 kHz per element, the time length $T = 1000/10^8 = 10$ u sec. If we use a quartz medium, the physical length L would be:

$$L = VT = 5 \times 10^3 \text{ m/sec} \times 10^{-5} \text{ sec}$$

and $$L = 0.05m = 5 \text{ cm}$$

If the bandwidth were reduced, say, to 50 MHz and if a 1000-element resolution remained a requirement, the length L would have to be doubled to 10 cm. If a medium different from quartz is employed, such as a $TeO_2$ element which we presently prefer, the length would be changed accordingly to reflect the characteristics of $TeO_2$. Alternately, the length could be retained the same if lower acoustic velocity material is employed. Thus, the material used in element 60 is selected on the basis of desired size and acoustic electro-optic properties.

Figure 5:
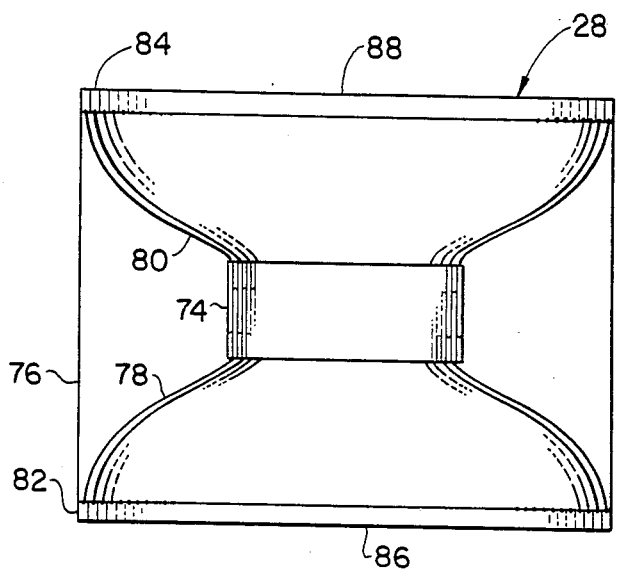
FIG. 5 is a schematic diagram of a programmable spatial filter embodied in the invention.
Figure 6:
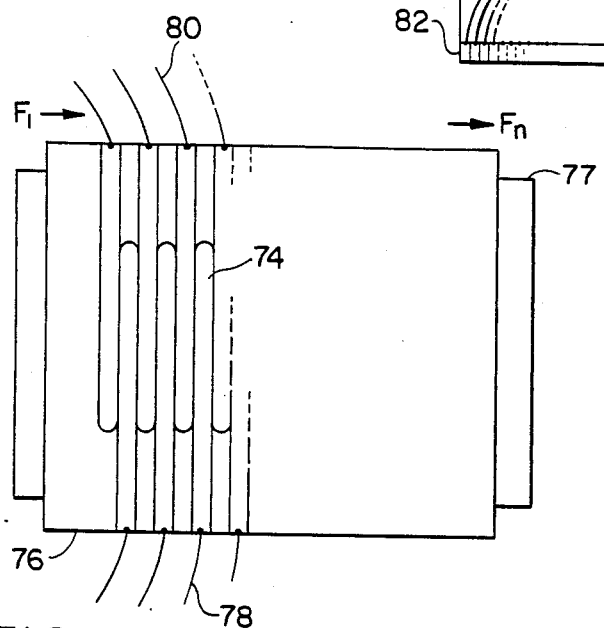
FIG. 6 is a schematic diagram showing the liquid crystal filter elements of the filter of FIG. 5 in greater detail.
Figure 7:
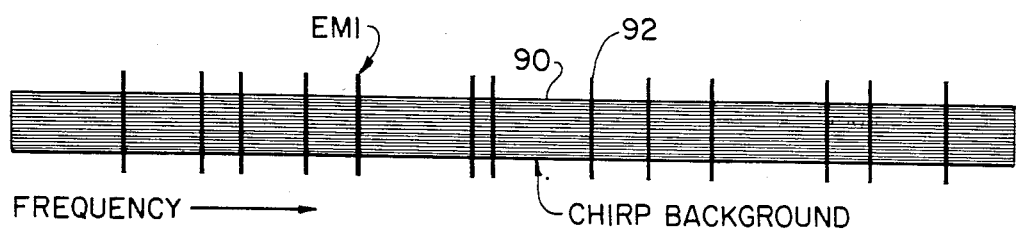
FIG. 7 is a representation of an RF signal including noise as detected in the optical Fourier plane of the system of the invention.
Figure 8:
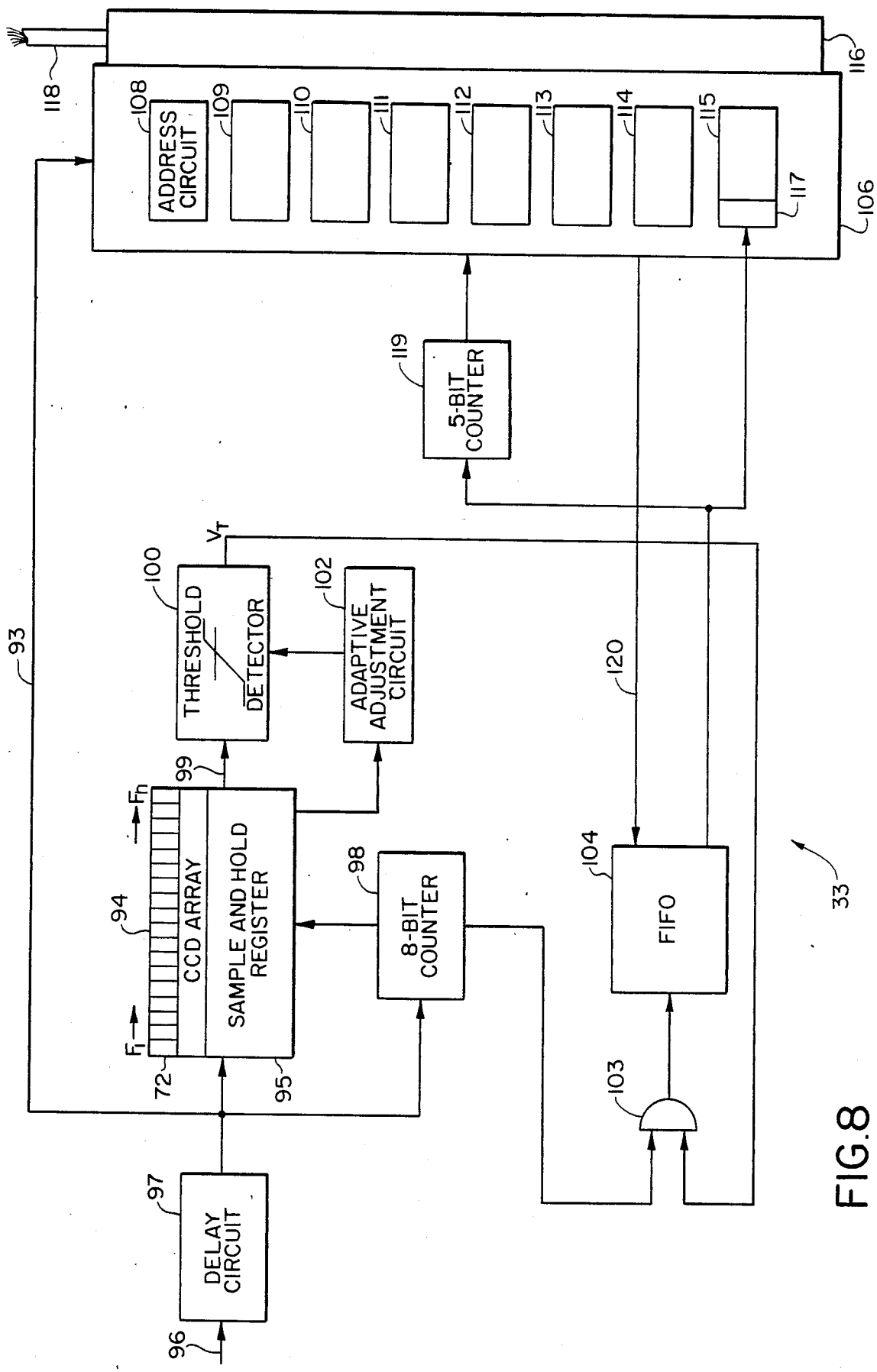
FIG. 8 is a schematic diagram showing a cueing system for programming the programmable spatial filter embodied in the invention.

The AOM imposes a narrow-band phase modulation on the radiation beam 64 therefrom. This beam is corrected for suitable polarization by a waveplate 66 and a Fourier transform thereof is taken with appropriate means such as lens 26 so that, at the back focal plane, the spectrum of the RF signal (g (t)) is spatially distributed one-dimensionally. This signal contains a one-for-one spatial and temporal correspondence with the RF frequency distribution. The transformed beam is then passed through the beamsplitter 68 associated with the scan control system 30 of the cueing system 33. Beamsplitter 68 directs part of the energy of the transformed beam through a suitable imaging lens 70 which images it on a linear photo charge-coupled device (CCD) array 72 of the scan control system 30. The major part of the energy passes directly through the beamsplitter and is imaged on the PSF 28. The PSF is essentially a comb filter (see FIGS. 5 and 6) having liquid crystal teeth-like columns or segments 74 arranged linearly on a suitable transparent plate 76 having a transparent backplane 77 in the path of the transformed radiation passing through beamsplitter 68. Each liquid crystal segment 74 is connected by means of conductors 78 and 80 to terminals 82 and 84 on the edges 86 and 88 respectively of plate 76 such that connections can be made thereto for passing an electric current selectively through the segments. Terminals 82 and 84 are suitably plugged into terminating means (not shown) in electrical conduit 86 such that the PSF is in circuit with the filter activation system 32 of the cueing receiver 33. In the PSF, each segment 74 corresponds to a narrow RF frequency band. In a practical embodiment of our invention, 256 segments which can be activated as required selectively in any combination are provided. It will be appreciated that a number of segments greater or fewer than 256 can be provided if the application so dictates. When not activated, the PSF is highly transmissive optically and passes incident radiation substantially unchanged to the inverse optical transform lens 34. However, when a segment is activated by an electrical signal from the filter activation system 37, the change in alignment of the constituent crystals in the liquid crystal due to the imposed electrical field renders the element opaque. This blocks the passage of light therethrough to thus notch out radiation of a narrow frequency band of the signal spectrum. In liquid crystals, as is well known, optical attenuation is achieved by cross-polarization, or scattering, or the like. To simplify the explanation of our invention, however, the liquid crystal segments will be said to have been rendered opaque by the imposition of an electrical field thereon irrespective of the phenomenon, whether it be scattering or the like, that is actually involved in the optical attenuation. When the filtering system of our invention is employed in a radar system, the signals being processed are usually of the "chirp" type in which the carrier frequency of the pulse is increased in a linear manner for the duration of the pulse. The output from the receiver 14 which includes the electrical representation of the received RF signal and any EMI noise associated therewith is passed through conductor 18 to the transducer 62 of the AOM 24 which impresses both the temporal and spatial intelligence of the RF signal and EMI on the radiation beam 56 directed therethrough. As has been described previously herein, the modulated radiation from the AOM is Fourier transformed and the beamsplitter 68 directs energy therefrom to the CCD array 72 of the scan control system 30. As indicated in FIG. 7 which shows a typical received RF signal having the signal chirp background 90 with discrete EMI noise signals 92 as detected in the Fourier plane of the present system, the unwanted EMI in the received RF signal is usually greater in amplitude than the desired signal intelligence which has a lower spectral power density. The CCD array 72 is composed of a linear arrangement of photosensitive CCD elements 94, the outputs of which are fed into a suitable sample and hold register 95 such as those available from EG&G, Inc., Salem, Mass. Each CCD element is operatively associated preferably with a specific one of the linear liquid crystal segments 74 of the PSF 28. In the embodiment described herein in which the PSF has 256 liquid crystal segments, CCD array 72 would thus preferably have 256 CCD elements. Each CCD element will represent some specific frequency band $F_1-F_n$ of the spread frequency spectrum of the RF signal imposed by the AOM on the radiation beam 56 and will be associated with a liquid crystal segment representing the same frequency band in the PSF. Preferably each specific element of the CCD array is associated with a specific segment of the PSF. It will be appreciated however, that a differing number of CCD elements and PSF segments can be employed. For example, if the CCD array has a number of elements double the number of PSF segments, two CCD elements would thus be associated with each PSF segment, and so forth. Because the EMI noise signals usually have a greater spectral power density than the desired signal, the individual CCD elements can be set to readily identify EMI signals and thus locate where they reside at that particular instant in the frequency band. In operation, the cueing system 33 is triggered by a 1 μsec synchronization pulse received through conductor 96 from radar receiver 14. The same 1 μsec synchronization pulse is transmitted through conductor 93 to set a Liquid Crystal Decoder Drive System (LCDD) 106 whose operation will be subsequently described. Preferably a LCDD such as a HLCD-438 commerically available from Hughes Aircraft Co., El Segundo, Calif., is employed. This pulse is delayed a preselected interval in a delay circuit 97 (see FIG. 8) to allow the CCD array 72 to integrate the optical spectrum of the energy incident thereon from beamsplitter 68. Circuit 97 can comprise a monostable dual one-shot single chip with a 2 m sec integration time such as a 74-LS 123 chip commercially available from Texas Instruments Incorporated, Dallas, Tex. This pulse is also used to set an 8-bit counter 98. At the end of the integrating interval, the voltage analogue of the spectrum stored in the CCD array is passed through an adjustable threshold detector 100. The threshold detector 100 is controlled by an adaptive adjustment circuit 102 which senses the chirp background level 90 of the modulated radiation incident on the CCD array and adjusts the threshold detector to pass voltage levels of the signal spectrum voltage analogue which correspond to the EMI noise signals or spikes 92. In the voltage analogue of the Fourier transformed signal radiation at the Fourier plane, the EMI noise spikes will be located in a precise position corresponding to their location in the RF radiation spectrum. Threshold output $V_T$ is then passed to AND gate 103 whose output when "anded" by control signals from 8-bit counter 98 is passed in binary form to a First-In-First-Out (FIFO) 32-byte semiconductor memory 104. The FIFO memory is in circuit with LCDD 106 of the PSF activation system 32. The LCDD is provided with a 5-bit counter 119 and with eight 32-bit address circuit chips 108–115 whose output terminals are mated with the connector 116 of an electrical conduit 118 connecting the CDD 106 with the PSF 28. Each of the circuit chips 108–115 has a shift register and a latching circuit (not shown) and a decoder circuit 117 is also incorporated in address circuit chip 115. A ready pulse from the LCDD through conductor 120 when the LCDD is ready to receive triggers the FIFO memory and the EMI noise spike locations stored therein are then clocked out in the form of an 8-bit address. The three Most Significant Bits of the 8-bit address are passed to the decoder circuit 117 in address circuit chip 115 and are used to determine which of the address circuit chips 108–115 receives the remaining five bits of the 8-bit address. The 5-bit counter 119 processes the five bits and passes the address information to the shift register of the particular address circuit chip 108–115 determined by the decoder circuit 117. These EMI locations are latched in parallel in the LCDD and serve to activate the liquid crystal segments 74 of the PSF corresponding to the equivalently located elements of the CCD array to render those PSF segments opaque to the spread spectrum radiation signal passing through the PSF. Thus, the EMI spikes present in the signal are effectively deleted or notched out. This filter activation process and subsequent filtering of the signal is repeated each time a 1 μsec radar synchronization pulse is received through conductor 93 by the filter activation system 32. It will be appreciated that the synchronization pulse will empty the data previously latched in the LCDD 106 such that the address circuit chips are cleared for the reception of further sets of filter segment address information when the filter activation cycle described above is repeated.

Figure 9:
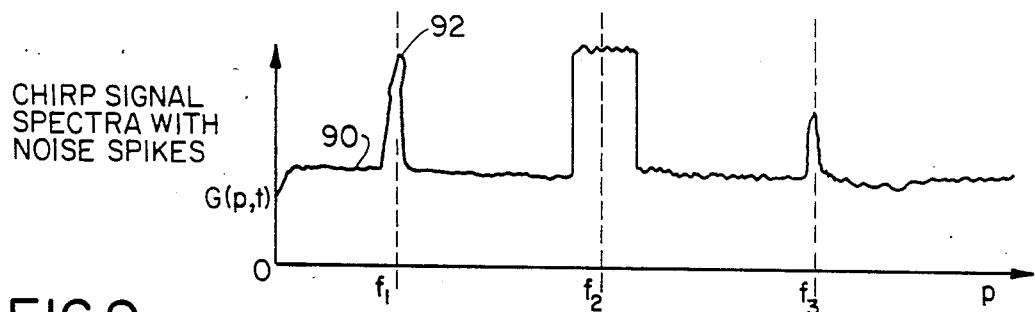
FIG. 9 is a representation of the spread spectrum signal input to the programmable spatial filter embodied in the invention.
Figure 10:
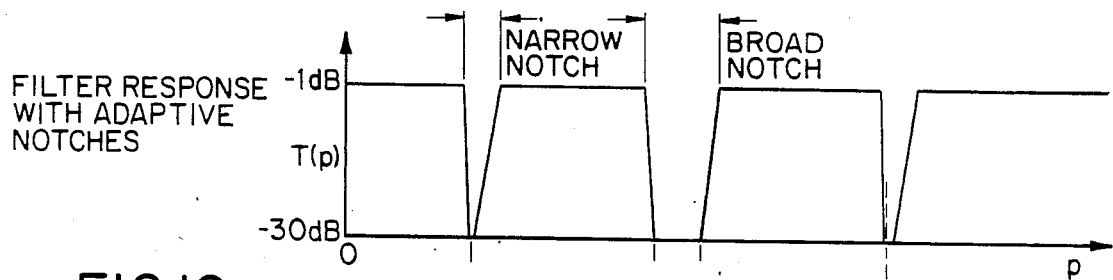
FIG. 10 is a representation of the response of the spatial filter of the invention programmed to delete the noise spikes of the input signal represented in FIG. 9.
Figure 11:
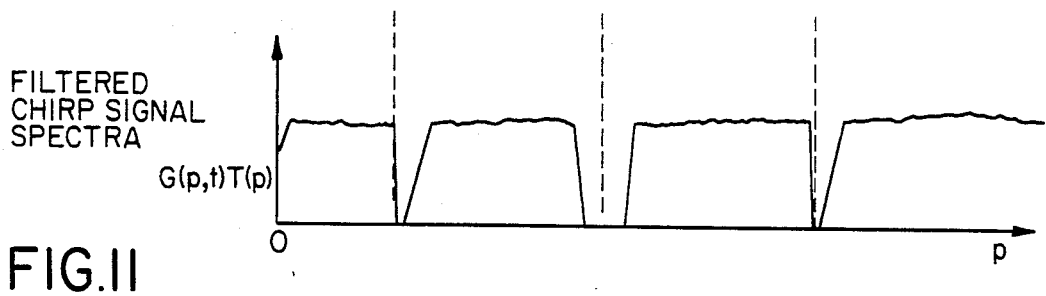
FIG. 11 is a representation of the spread spectrum signal output of the programmable spatial filter with the noise spikes of the input signal notched out.

The filtering process is perhaps best depicted graphically in a simplified form as shown in FIGS. 9-11. FIG. 9 shows the chirp signal spectra incident on the PSF. As described previously herein the same signal G (p,t) including EMI noise spikes 92 at $f_1$, $f_2$, and $f_3$ is also incident on the photo CDD array 72 of the filter activation system 30 (see FIGS. 3 and 5). FIG. 10 depicts the pass band or the filter response of the PSF showing the notches programmed into the filter by the cueing system 33. FIG. 11 depicts the output of the PSF showing the chirp signal with the noise spikes notched out of the band by the activation of the filter segments 74 (see FIGS. 5 and 6). A notch depth of 29 dB is shown in FIG. 10, but it will be appreciated that greater or lesser notching depths are attainable by use of various electroptic materials and appropriate voltage controllable means as required. It will also be appreciated that the notching adaption of the filter in response to EMI in the signal will change to accommodate changes in the EMI spectra each time the radar synchronization pulse triggers the filter activation system.

After having the EMI removed by the PSF, the filtered signal beam is passed through transform means such as lens 34 to effect an inverse optical Fourier transformation and a sharp focusing of the beam for detection. The beam is then summed with an unmodulated local oscillator (l0) laser beam 48 in an optical combining means 36 to generate a difference frequency by a heterodyning action. As indicated in FIG. 3, LO beam 48 is extracted from the laser output beam 42 by beam-splitter 46. Beam 48 is passed through a beam expander 122 to produce a sheet beam which is focused by a suitable lens 124 and is then directed by means such as a mirror 126 to the combining means 36 for summing with the signal beam. It will be understood, of course, that the LO beam can be derived in a well known manner from means other than those shown in FIG. 3. This combined signal is square-law-detected by a broadband photo-dector 38. Preferably the effective combining occurs in a very narrow region or slit to preserve the content of the signal g(t) which at the output is 2 LO g'(t−$T_0$); it will be seen, therefore, that the amplitude is proportional to the LO beam and signal and that the output is delayed by a fixed time $T_0$ which is adjustable by changing the position of the photodetector 38 with respect to the inverse transform plane. The electrical output of the photodetector is filtered by band-pass filter 40 to remove outband noise and the filtered output 128 is sent to the radar receiver detector (not shown) for conventional post-processing.

Although shown and described in what are believed to be the most practical and preferred embodiments, it is apparent that departures from the specific methods and designs described and shown will suggest themselves to those skilled in the art and may be made without departing from the spirit and scope of the invention. We, therefore, do not wish to restrict ourselves to the particular constructions described and illustrated, but desire to avail ourselves of all modifications that may fall within the scope of the appended claims.

Having thus described our invention, what we claim is:

1. In an optical method for RF receivers for the multifrequency filtering of RF narrow-band interfering signals, the steps comprising:

inputting RF input signals from said receiver into an acousto-optical modulator:

passing a beam of substantially coherent radiation through said acousto-optical modulator to modulate said beam with said RF signal input;

transforming said modulated beam by passing it through optical Fourier transform means to produce a transformed beam having a spatial frequency distribution at the back focal plane of said transform means corresponding with said RF signal input frequency distribution, said back focal plane being the Fourier plane;

diverting energy from said transformed modulated beam and impinging it on sensing means such that the spectral frequency location in said beam of narrow-band interfering signals whose amplitude exceeds a predetermined background level is detected;

programming a spatial filter located at said Fourier plane with the spectral location of said detected narrow-band interfering signals;

passing said transformed modulated beam through said programmed spatial filter such that said detected interfering signals at said spectral locations are deleted;

optically inversely transforming said filtered beam from said spatial filter by passing it through an optical inverse Fourier transform means having its front focal plane at said Fourier plane to transform said filtered RF spectra into the time domain;

optically combining said inversely transformed beam with an optical local oscillator reference beam to eliminate positional dependence and to generate a difference frequency by a heterodyning action;

impinging said combined beams on a square-law photodetector at the inverse transform plane of the inverse transform means;

passing the photodetector output to said RF receiver for post processing.

2. In an optical method for RF spread spectrum receivers for the multifrequency filtering of RF narrow-band interfering signals, the steps comprising:

inputting RF input signals from said receiver into an acousto-optical modulator;

passing a beam of substantially coherent radiation through said acousto-optical modulator to modulate with said RF signal input;

transforming said modulated beam by passing it through optical Fourier transform means to produce a transformed beam having a spatial frequency distribution at the back focal plane of said transform means corresponding with said RF signal input spread spectrum frequency distribution, said back focal plane being the Fourier plane;

diverting energy from said transformed modulated beam and impinging it on a linear array of photodetectors, said photodetectors in said linear array detecting the linear location in the incident spread spectrum radiation of narrow-band interfering signals whose amplitude exceeds a predetermined background level;

programming a spatial filter positioned at said Fourier plane with the spectral location of said detected narrow-band interfering signals, said spatial filter having a comb-like linear arrangement of segments corresponding substantially with said photodetectors in said linear array, such that photodetectors in said array receiving radiation of an amplitude representing a narrow-band interfering signal produce an output which renders its associated filter segment in said linear arrangement opaque to block radiation at the spectral location to notch said narrow-band interfering signal out of the radiation passing through said spatial filter;

optically inversely transforming the filtered beam from said spatial filter by passing it through an optical inverse Fourier transform means having its front focal plane at said Fourier plane to transform said filtered RF spectra into the time domain;

optically combining said inversely transformed beam with an optical local oscillator reference beam to eliminate positional dependence and to generate a difference frequency by a heterodyning action;

impinging said combined beams on a square-law photodetector at the inverse transform plane of the inverse transform means;

electrically filtering the photodetector output to remove outband noise;

passing the filtered photodetector output to said RF receiver for post processing.

3. In an optical method for RF spread spectrum receivers for the multifrequency filtering of RF narrow-band interfering signals, the steps comprising:

inputting RF input signals from said receiver into an acousto-optical modulator;

passing a beam of substantially coherent radiation through said acoustr-optical modulator to modulate said beam with said RF signal input;

transforming said modulated beam by passing it through optical Fourier transform means to produce a transformed beam having a spatial frequency distribution at the back focal plane of said transform means corresponding with said RF signal input spread spectrum frequency distribution, said back focal plane being the Fourier plane;

diverting energy from said transformed modulated beam and impinging it on a linear array of photodetectors, said photodetectors in said linear array detecting the linear location in the incident spread spectrum radiation of narrow-band interfering signals whose amplitude exceeds a predetermined background level;

intergrating the optical spectrum detected by said linear array of photodetectors to derive the voltage analogue of said spectrum;

passing said voltage analogue through a threshold detector which is set to pass voltage signals corresponding to the amplitude of said interfering signals;

providing address means to designate an address which codes the precise position of each of said interfering signals corresponding to their location in the RF radiation spectrum;

programming a spatial filter positioned at said Fourier plane using said address code to designate the spectral location of said detected narrow-band interfering signals, said spatial filter having a comb-like linear arrangement of segments having a substantially one to one correspondence with said photodetectors in said linear array such that the filter segments at the addresses designating narrow-band interfering signals are rendered opaque to block radiation at the spectral location to notch said narrow-band interfering signals out of the radiation passing through said spatial filter;

optically inversely transforming the filtered beam from said spatial filter by passing it through an optical inverse Fourier transform means having its front focal plane at said Fourier plane to transform said filtered RF spectra into the time domain;

optically combining said inversely transformed beam with an optical local oscillator reference beam to eliminate positional dependence and to generate a difference frequency by a heterodyning action;

impinging said combined beams on a square-law photodetector at the inverse transform plane of the inverse transform means;

electrically filtering the photodetector output to remove outband noise;

passing the filtered photodector output to said RF receiver for post processing.

4. In an optical method for RF spread spectrum receivers for the multifrequency filtering of RF narrow-band interfering signals, the steps comprising:

inputting RF input signals from said receiver into an acousto-optical modulator;

passing a beam of substantially coherent radiation through said acousto-optical modulator to modulate said beam with said RF signal input;

transforming said modulated beam by passing it through optical Fourier transform means to produce a transformed beam having a spatial frequency distribution at the back focal plane of said transform means corresponding with said RF signal input spread spectrum frequency distribution, said back focal plane being the Fourier plane;

diverting energy from said transformed modulated beam and implinging it on a linear array of photodectors, said photodetectors in said linear array detecting the linear location in the incident spread spectrum radiation of narrow-band interfering signals whose amplitude exceeds a predetermined background level;

integrating the optical spectrum detected by said linear array of photodetectors to derive the voltage analogue of said spectrum;

passing said voltage analogue through a threshold detector which is set to pass voltage signals corresponding to the amplitude of said interfering signals;

providing address means to designate an address which codes the precise position of each of said interfering signals corresponding to their location in the RF radiation spectrum;

programming a spatial filter positioned at said Fourier plane using said address code to designate the spectral location of said detected narrow-band interfering signals, said spatial filter having a comb-like linear arrangement of liquid crystal segments having a substantially one-to-one correspondence with said photodetectors in said linear array, the crystalline structure of said segments changing its alignment under the influence of an electric field to vary the light-transmitting properties thereof, each of said liquid crystal segments being in circuit electrically through said address means with a specific associated photodector in said linear photodetector array, an electric field being applied to said liquid crystal segments under the designation of said address means in correspondence with the linear location of interfering signals detected by said linear array such that the filter segments at the addresses designating narrow-band interfering signals are rendered opaque to block radiation at that spectral location to notch said narrow-band interfering signals out of the radiation passing through said spatial filter;

optically inversely transforming the filtered beam from said spatial filter by passing it through an optical inverse Fourier transform means having its front focal plane at said Fourier plane to transform said filtered RF spectra into the time domain;

optically combining said inversely transformed beam with an optical local oscillator reference beam to eliminate positional dependence and to generate a difference frequency by a heterodyning action;

impinging said combined beams on a square-law photodetector at the inverse transform plane of the inverse transform means;

electrically filtering the photodetector output to remove outband noise;

passing the filtered photodetector output to said RF receiver for post processing.

5. An optical spatial filtering system for RF spread spectrum signals comprising: an RF signal source, a radiation source for producing a beam of substantially coherent collimated optical radiation, an acousto-optical modulator driven by Rf signals from said RF source, means for producing an optical Fourier transform of said optical radiation beam modulated by said RF signals, a programmable optical notching filter at the back focal plane of said optical Fourier transform means, said back focal plane being the Fourier plane, means for diverting energy from said modulated radiation beam, linear array means for sensing the location in the frequency domain of narrow-band interfering signals in said diverted modulated radiation beam, means using the output of said linear array of sensing means for programming said programmable notching filter to reject signals having an amplitude above a predetermined threshold, optical means having its front focal plane at said Fourier plane for producing an inverse optical transform, an optical local oscillator, an optical beam combiner, detecting means at the inverse transform plane of said inverse optical transform means for converting optical input signals into an electrical output, and an electrical bandpass filter, whereby RF signals from said RF source are used to drive said acousto-optical modulator to impress a spread RF spectrum on said beam of optical radiation and an optical Fourier transform is taken of said modulated beam of radiation, which transformed beam is filtered by said programmable filter to notch out signals in said spread spectrum whose amplitude has identified them as comprising noise and said filtered optical radiation is inversely optically Fourier transformed and combined by said beam combiner with radiation from said local oscillator such that positional dependence is eliminated to produce a summed output which is detected by said detecting means, the electrical output of which is filtered by said band-pass filter to thereby deliver down-converted EMI-free RF spectra for post processing in said RF receiver.

6. The optical filtering system set forth in claim 5 wherein the linear array means for sensing is a linear array of photodetectors, said photodetectors in said array detecting the linear location in the incident spread spectrum radiation of narrow-band interfering signals whose amplitude exceeds a predetermined background level.

7. The optical filtering system set forth in claim 6 wherein the optical spectrum detected by said linear array is integrated to derive the voltage analogue of said spectrum, said voltage analogue being processed in a threshold detector which outputs voltage signals exceeding a predetermined amplitude.

8. The optical filtering system set forth in claim 5 wherein the programmable filter has a comb-like linear arrangement of segments having a substantially one-to-one correspondence with said photodetectors in said linear array such that said filter segments can be programmed to become opaque at locations designated by the linear array of sensing means to block radiation at that spectral location to notch narrow-band interfering signals.

9. The optical filtering system set forth in claim 8 wherein the linear arrangement of segments of the programmable filter are liquid crystals, the crystalline structure of which changes its alignment under the influence of an electric field to vary the light-transmitting properties thereof, each of said segments being in circuit electrically with a specific associated photodetector in the linear photodetector array, an electric field being applied to said segments by said linear photodetector array to render said segments opaque at the locations identifying narrow-band interfering signals such that those signals are notched by said filter.

10. The optical filtering system set forth in claim 7 wherein the threshold detector output is passed to address means to designate notching means in the programmable notching filter at the locations in the RF radiation spectrum of narrow-band interfering signals such that said notching means can be programmed to notch said interfering signals.

* * * * *

UNITED STATES PATENT AND TRADEMARK OFFICE
CERTIFICATE OF CORRECTION

PATENT NO. : 4,699,466
DATED : October 13, 1987
INVENTOR(S) : Robert W. Brandstetter et al It is certified that error appears in the above-identified patent and that said Letters Patent is hereby corrected as shown below:

[57], line 9, "focused" should be deleted.

Col. 1, line 20, "cascade" should be -- cascaded --

Col. 2, line 27, "Rf" should be -- RF --

Col. 3, line 59, "etalou" should be -- Etalon --

Col. 5, line 10, "37" should be -- 32 --

Col. 6, line 39, "CDD" should be -- LCDD --

Col. 7, line 30, "(10)" should be -- (LO) --

Col. 8, line 47, which is claim 2, "with" should be -- said beam with --

Col. 9, line 29, which is claim 3, "acoutr-optical" should be -- acousto-optical --

Col. 10, line 33, which is claim 4, "implinging" should be -- impinging --. Col. 11, line 25, which is claim 5, "Rf" should be -- RF --.

Signed and Sealed this

Fourteenth Day of March, 1989

*Attest:*

DONALD J. QUIGG

*Attesting Officer*   *Commissioner of Patents and Trademarks*